(12) United States Patent
Biloiu et al.

(10) Patent No.: US 9,514,912 B2
(45) Date of Patent: Dec. 6, 2016

(54) CONTROL OF ION ANGULAR DISTRIBUTION OF ION BEAMS WITH HIDDEN DEFLECTION ELECTRODE

(71) Applicant: Varian Semiconductor Equipment Associates, Inc., Gloucester, MA (US)

(72) Inventors: Costel Biloiu, Rockport, MA (US); Peter F. Kurunczi, Cambridge, MA (US); Tyler Rockwell, Wakefield, MA (US); Christopher Campbell, Newburyport, MA (US); Vikram Singh, North Andover, MA (US); Svetlana Radovanov, Brookline, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 265 days.

(21) Appl. No.: 14/523,428

(22) Filed: Oct. 24, 2014

(65) Prior Publication Data

US 2016/0071693 A1     Mar. 10, 2016

Related U.S. Application Data

(60) Provisional application No. 62/048,584, filed on Sep. 10, 2014.

(51) Int. Cl.
*H01J 37/08* (2006.01)
*H01J 27/02* (2006.01)
(Continued)

(52) U.S. Cl.
CPC .............. *H01J 37/08* (2013.01); *H01J 27/024* (2013.01); *H01J 37/3171* (2013.01); *H01J 37/32357* (2013.01); *H01J 2237/061* (2013.01)

(58) Field of Classification Search
None
See application file for complete search history.

(56) References Cited

U.S. PATENT DOCUMENTS

| 7,767,977 B1 * | 8/2010 | Godet ................... H01J 27/024 |
| | | 250/423 R |
| 9,293,301 B2 * | 3/2016 | Biloiu ............... H01J 37/32357 |
| (Continued) | | |

OTHER PUBLICATIONS

ISR and Written Opinion mailed Dec. 8, 2015, in corresponding International Patent Application No. PCT/JS2015/047356.
(Continued)

*Primary Examiner* — Jack Berman

(57) ABSTRACT

A processing apparatus may include: an extraction plate disposed along a side of a plasma chamber, the extraction plate having a first and second aperture, and middle portion between the first and second aperture, the first and second aperture being configured to define a first and second ion beam when the plasma is present in the plasma chamber and an extraction voltage is applied between the extraction plate and a substrate; a hidden deflection electrode disposed adjacent the middle portion outside of the plasma chamber, and electrically isolated from the extraction plate; and a hidden deflection electrode power supply to apply a bias voltage to the hidden deflection electrode, wherein the bias voltage is configured to modify a mean angle of incidence of ions and/or a range of angles of incidence centered around the mean angle of incidence in the first and second ion beam.

20 Claims, 10 Drawing Sheets

(51) Int. Cl.
  *H01J 37/32* (2006.01)
  *H01J 37/317* (2006.01)

(56) References Cited

U.S. PATENT DOCUMENTS

| | | |
|---|---|---|
| 2005/0211921 A1 | 9/2005 | Wieland |
| 2008/0132046 A1 | 6/2008 | Walther |
| 2011/0011534 A1 | 1/2011 | Dhindsa |
| 2011/0079355 A1 | 4/2011 | Brcka |
| 2011/0186749 A1 | 8/2011 | Godet |
| 2012/0104274 A1* | 5/2012 | Hirayanagi ............ B82Y 10/00 250/424 |
| 2014/0001372 A1 | 1/2014 | Schwind et al. |

OTHER PUBLICATIONS

Costel Biloiu, et al., In Situ Control of Ion Angular Distribution in a Processing Apparatus, U.S. Appl. No. 14/139,679, filed Dec. 23, 2013.

* cited by examiner

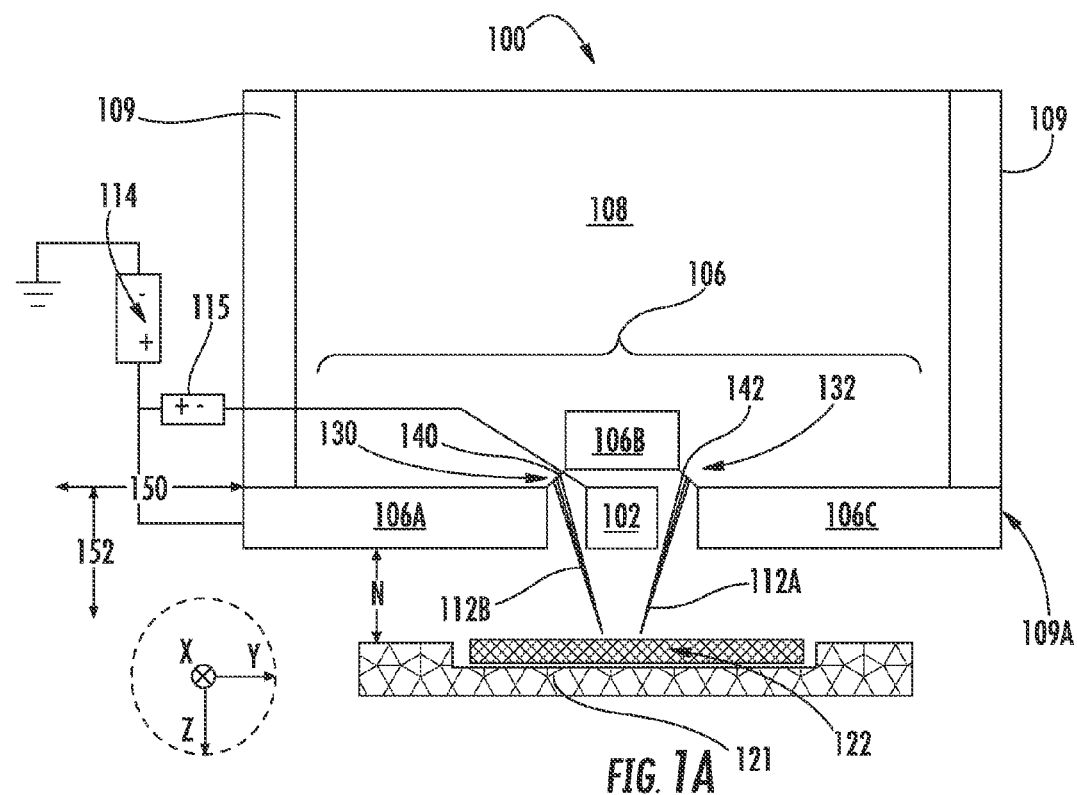
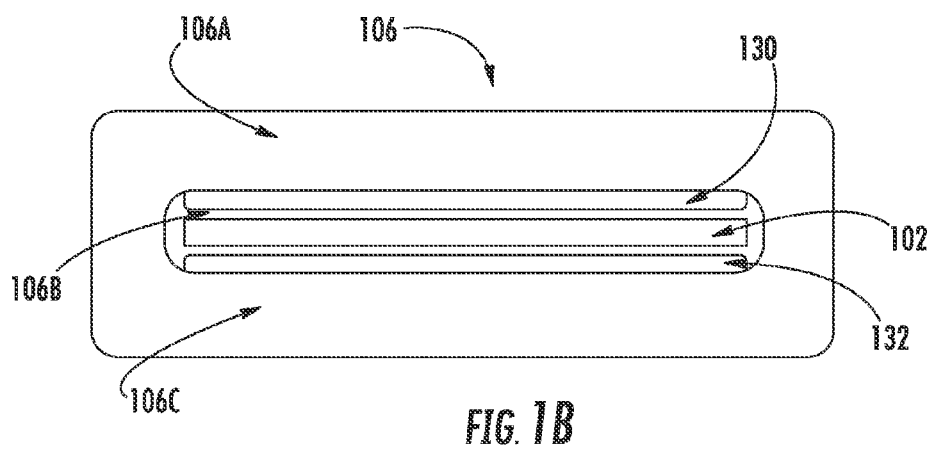

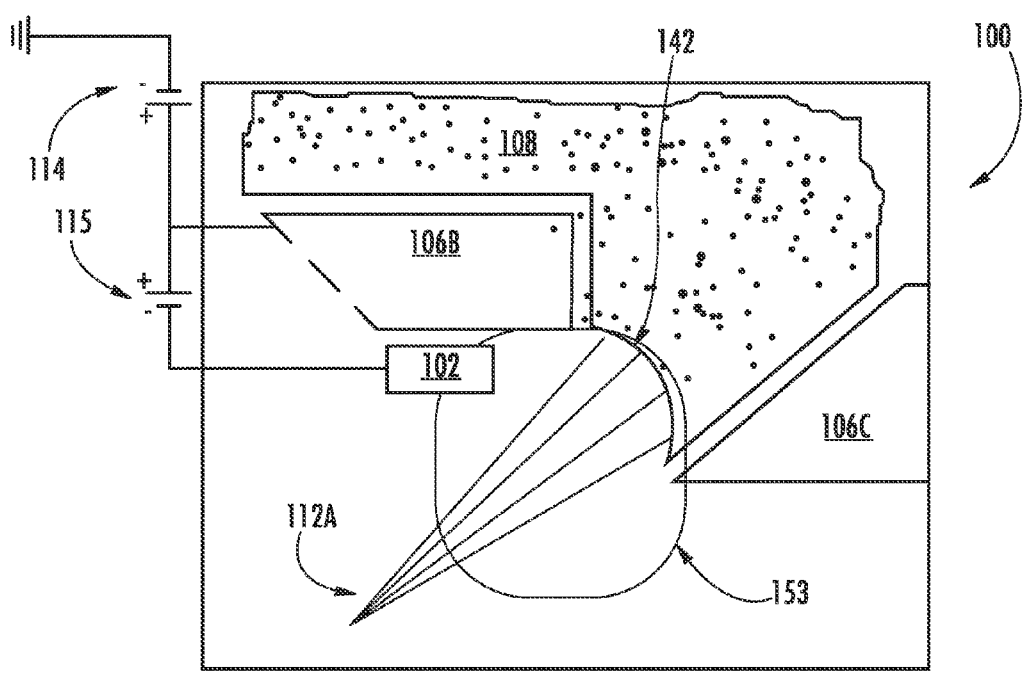
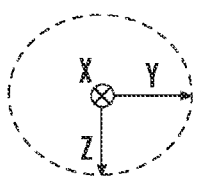
FIG. 1E

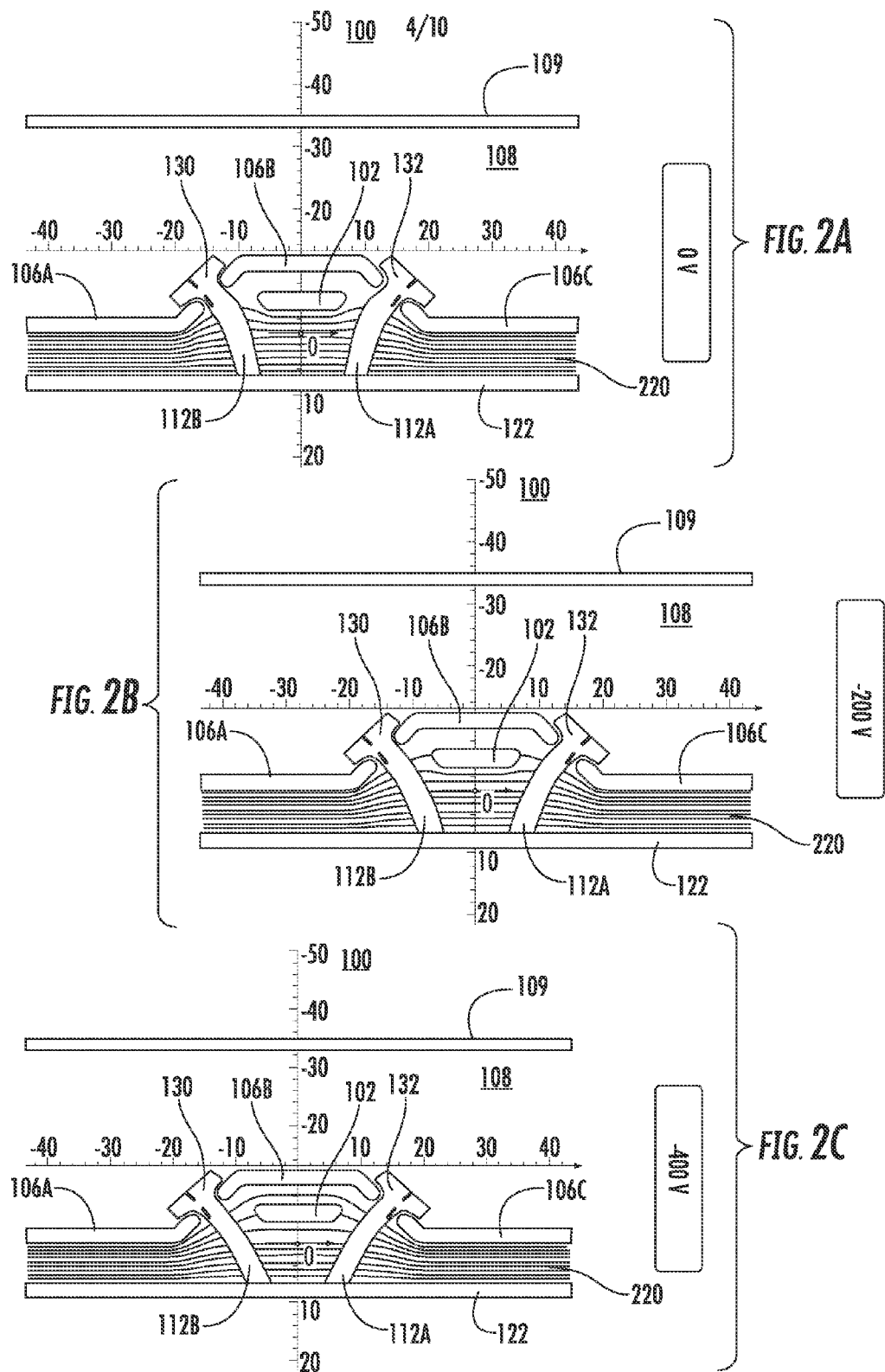

CONTROL OF ION ANGULAR DISTRIBUTION OF ION BEAMS WITH HIDDEN DEFLECTION ELECTRODE

CROSS-REFERENCE TO RELATED APPLICATIONS

This is a non-provisional of pending U.S. provisional patent application Ser. No. 62/048584, filed Sep. 10, 2014, the entirety of which application is incorporated by reference herein.

FIELD

The present embodiments relate to a plasma processing apparatus, and more particularly, how to control the angular distribution (mean angle and angular spread) of the ribbon ion beams extracted from a plasma source using a hidden deflection electrode in conjunction with a hidden focusing electrode.

BACKGROUND

Conventional apparatuses used to treat substrates with ions include beamline ion implanters and plasma immersion ion implantation tools. Both are appropriate for implanting ions over a range of energies. In beamline ion implanters, ions are extracted from a source, mass analyzed, and then transported to the substrate surface. In a plasma immersion ion implantation apparatus, a substrate is located in the same chamber and the plasma is generated adjacent to the plasma. The substrate is set at negative potential with respect to the plasma and ions that cross the plasma sheath in front of the substrate impinge on the substrate at perpendicular incidence angle. Recently a new processing apparatus that allows control of the extracted ion angular distribution (IAD) has been developed. In this apparatus ions are extracted from a plasma chamber but unlike the beamline where the substrate is located remotely from the ion source, the substrate is located proximate the plasma chamber. Ions are extracted through an aperture of special geometry located in an extraction plate that is placed proximate a plasma. Changing the geometry of the aperture allows changing of the ion angular distribution, i.e., the mean angle and angular spread of the ion distribution. This may be appropriate to treat substrates with 3D structures i.e., that present surface features whose sidewalls are to be exposed to ions, for the purposes of implantation, deposition, etching, or other processing. In order to treat such sidewalls, ions are extracted through the aperture of a certain shape and size to generate an ion beam width and ion angular distribution. Usually the aperture has an elongated shape so that ribbon ion beams having heights of 3-30 mm and widths of 350-400 mm might be extracted. In the case the ion beam is wider than the substrate to be processed (a 300 mm Si wafer for instance) a processing step can be achieved at once by passing the substrate in front of the ribbon beam. If more processing is desirable then the substrate is passed back and forth in the front of the beam as many times as is needed.

On the other hand, in addition to the beam shape and beam current, in a plasma processing system it may be desirable to provide further control over ion angular distribution (IAD). It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a processing apparatus may include an extraction plate disposed along a side of a plasma chamber, the extraction plate having a first aperture and a second aperture, and a middle portion between the first aperture and second aperture, the first aperture and second aperture being configured to define a first ion beam and second ion beam when the plasma is present in the plasma chamber and an extraction voltage is applied between the extraction plate and a substrate; a hidden deflection electrode disposed adjacent to the middle portion outside of the plasma chamber, and electrically isolated from the extraction plate; and a hidden deflection electrode power supply to apply a bias voltage to the hidden deflection electrode, wherein the bias voltage is configured to modify at least one of a mean angle of incidence of ions and a range of angles of incidence centered around the mean angle of incidence in the first ion beam and the second ion beam.

In one embodiment, a plasma processing system may include a plasma source coupled to a plasma chamber to generate a plasma in the plasma chamber; an extraction plate disposed along a side of the plasma chamber, the extraction plate having a first aperture and a second aperture, and a middle portion between the first aperture and second aperture and configured to define a first ion beam and second ion beam when the plasma is present in the plasma chamber and an extraction voltage is applied between the extraction plate and a substrate; an hidden deflection electrode disposed adjacent to the middle portion outside of the plasma chamber, and electrically isolated from the extraction plate; and a hidden deflection electrode power supply to apply a bias voltage to the hidden deflection electrode, wherein the bias voltage is configured to modify at least one of a mean angle of incidence of ions and a range of angles of incidence centered around the mean angle of incidence in the first ion beam and the second ion beam.

In a further embodiment, a method of controlling an ion beam provided to a substrate using a hidden deflection electrode includes generating a plasma in a plasma chamber adjacent a process chamber that contains the substrate; providing an extraction plate disposed along a side of the plasma chamber, the extraction plate having a first aperture and a second aperture, and a middle portion between the first aperture and second aperture, the first aperture and second aperture being configured to define a first ion beam and second ion beam when the plasma is present in the plasma chamber and an extraction voltage is applied between the extraction plate and a substrate; arranging the hidden deflection electrode adjacent to the middle portion outside of the plasma chamber, and electrically isolated from the extraction plate; and applying a bias voltage to the hidden deflection electrode, wherein the bias voltage is configured to modify at least one of a mean angle of incidence of ions and a range of angles of incidence centered around the mean angle of incidence in the first ion beam and the second ion beam.

BRIEF DESCRIPTION OF THE DRAWINGS

FIG. 1A presents a vertical cross-section (Oyz plane) of processing apparatus consistent with embodiments of this disclosure;

FIG. 1B presents a top view of an extraction optics of the processing apparatus of FIG. 1A.consistent with embodiments of this disclosure;

FIG. 1E presents an exploded cross-section view (Oyz plane) of the ion extraction region of processing apparatus of FIG. 1A. consistent with embodiments of this disclosure;

FIGS. 2A-2C depict the operation scenarios for the processing apparatus of FIG. 1A and illustrate beamlets, shapes, and electrostatic potential distributions in the extraction area for 2 kV extraction voltage and bias voltages of 0, −200, and −400 Volt;

DETAILED DESCRIPTION

Figure 1C:
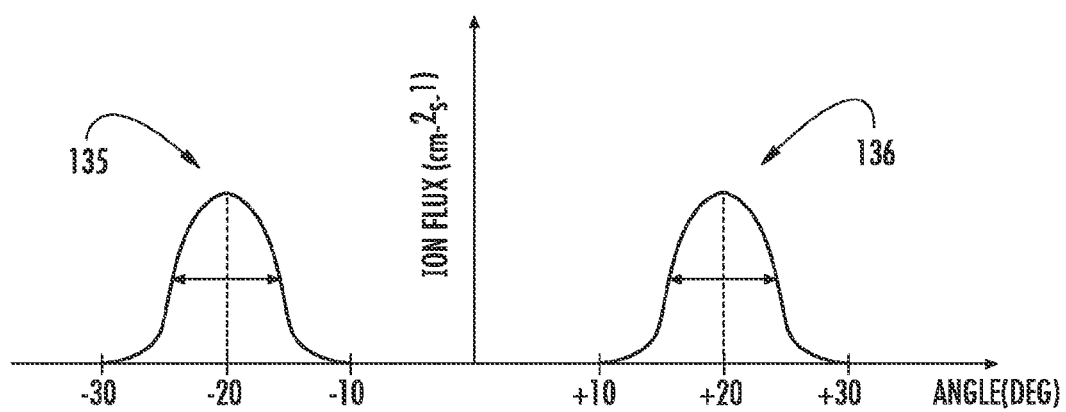
FIG. 1C present an exemplary ion angular distribution.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide apparatus, systems, and methods for controlling angular distribution of ions directed to a substrate using a hidden deflection electrode. In particular, the present embodiments provide a novel extraction system to generate ion beams from a plasma and control their ion angular distribution (IAD). The term "ion angular distribution" refers to the mean angle of incidence of ions in an ion beam with respect to a reference direction such a perpendicular to a substrate, as well as to the width of distribution or range of angles of incidence centered around the mean angle, termed "angular spread" for short. In the embodiments disclosed herein, the novel extraction system may include an extraction plate disposed along a side of the plasma chamber, the extraction plate having a first elongated aperture and a second elongated aperture, and a middle portion between the first aperture and second aperture and configured to define a first ribbon ion beam and second ribbon ion beam when the plasma is present in the plasma chamber, an extraction voltage is applied between the extraction plate and the substrate, a hidden deflection electrode is disposed adjacent to the middle portion outside of the plasma chamber, and electrically isolated from the extraction plate, and a deflection electrode power supply to apply a bias voltage to the hidden deflection electrode, wherein the bias voltage is configured to at least one of a mean angle of incidence of ions and a range of angles of incidence centered around the mean angle in the first ion beam and the second ion beam. As detailed below, the angle of incidence of ion beams is controlled by adjusting voltages applied to the extraction system and/or by adjusting positioning of the various components of the extraction system, by adjusting plasma density (i.e., gas pressure and/or rf power) or all. The hidden deflection electrode may be deemed to be "hidden" from the plasma chamber or from the plasma when ions that are extracted from the plasma through a meniscus do not strike the hidden deflection electrode.

For plasma processing of high aspect ratio semiconductor structures, the provided apparatus, systems, and methods provides the benefit of having ion beams whose ion angular distribution (IAD) could be in situ controlled and steered without striking of the extraction optics constituents.

This is in contrast to a processing system that controls ion angular distribution by using a biased deflection electrode that is immersed in the plasma adjacent to an extraction aperture provided in an extraction electrode. In this case because of the bias electrode's location within the plasma, during operation, especially at high bias voltages, the bias electrode is exposed to high-energy ion bombardment. As a result, the material of the bias electrode may sputtered. Sputtered atoms may coagulate forming small particles that deposit on the processed substrate and adversely affect the process.

To extract positive ions from the plasma, an extraction voltage may be applied between the electrically conductive parts of the plasma chamber and the substrate by either grounding the substrate and elevating the plasma chamber at positive potential, or grounding the plasma chamber and placing the substrate at a negative potential. The bias electrode may be composed of conductive material biased at a negative potential (e.g., 0 V to −1000 V) with respect to the plasma chamber, such that the bias electrode provides considerable control over IAD (e.g., variation in mean angle of incidence of 30° and providing an angular spread range from 4° to 25°.

However, because of the bias electrode's location within the plasma, during operation, especially at high bias voltages, the bias electrode is exposed to ion bombardment. As a result, the material of the bias electrode is sputtered. Sputtered atoms may coagulate forming small particles that deposit on the processed substrate and decrease the quality of a substrate material.

As detailed below, in the present embodiments, the apparatus, systems, and methods provide the benefit of generating ion beams whose ion angular distribution (IAD) may be controlled in an in situ manner without electrode sputtering by using a deflection electrode that is hidden or concealed from the bulk plasma in a plasma chamber rather than being immersed in the plasma. Such a benefit is provided by using an ion beam extraction optics system that maintains the characteristics of in situ controllable IAD while mitigating the detrimental effect of electrode sputtering. In addition the apparatus and systems disclosed herein provide an independent control of mean angle and angular spread without subjecting the deflection electrode to electrode sputtering.

Consistent with various embodiments, the variation of ion beam angular distribution characteristics (mean angle and angular spread) may be accomplished by variation of any combination of changes of different parameters. The variation in ion beam shape, along with mean incidence angle and angular spread, may be achievable without breaking the vacuum of a processing apparatus. For this reason the present embodiments facilitate what is termed in-situ control of ion mean incidence angle, angular spread, in other words Ion Angular Distribution (IAD) of ions provided to a substrate. According to various embodiments in situ control that produces a variation of ion angular distribution may be performed by changes in position of the hidden deflection electrode and a hidden focusing deflection electrode; variation in one or more aperture sizes; changes in RF power delivered to the plasma; changes of the gas pressure; or changes in voltages applied to components of the processing apparatus, including voltage applied to the hidden deflection electrode, substrate holder/substrate, the extraction plate, or plasma chamber. The embodiments are not limited in this context.

FIG. 1A depicts a processing apparatus 100 consistent with embodiments of this disclosure. The processing apparatus 100 has a hidden deflection electrode 102 consistent with various embodiments of the disclosure. The processing apparatus 100 uses a plasma source to generate a plasma 108 in a plasma chamber 109. Plasma chamber 109 may have an "X" dimension size exceeding by 100-200 mm in order to obtain ion beams, such a first ion beam 112A and a second ion beam 112B, having a desired ion beam width.

An extraction plate 106 (illustrated as 106A, 106B, and 106C) is arranged along a side of the plasma chamber 109. In FIG. 1A, the extraction plate 106 (FIG. 1A 106 illustrated as 106A, 106B, and 106C as described below) is arranged at the bottom 109A of the plasma chamber 109. The extraction plate 106 may define a portion of a chamber wall of the plasma chamber 109. As shown in FIG. 1B the extraction plate 106 defines a first aperture 130 and a second aperture 132 through which ions may be extracted as ion beams (e.g., illustrated in FIG.1A as a pair of ion beams defined as a first ion beam 112A and a second ion beam 112B that may be termed ribbon ion beams) and directed toward a substrate 122 in a substrate holder 121. The length of the extraction aperture in X dimension may exceed by 50-100 mm the desired ribbon beam width. For instance, if a ribbon beam to process a 300 mm Si wafer is desired then the extraction slit length in X direction should be 350-400 mm. The extraction aperture opening in Y direction may be between 3 mm and 15 mm. The extraction plate 106 may be one plate having a middle portion 106B defined between an outer portion of the extraction plate 106, such as first outer portion 106A and second outer portion 106C of the extraction plate 106, on each side of the middle portion 106B of the extraction plate 106. The extraction plate 106 includes a first outer portion 106A of the extraction plate 106 outside the first aperture 130, a second outer portion 106C of extraction plate 106 outside of the second aperture 132 and coplanar with the first outer portion 106A. The first outer portion 106A, the middle portion 106B, and the second outer portion 106C are electrically conductive. The first outer portion 106A, the middle portion 106B, and the second outer portion 106C are movable with respect to one another along a direction parallel to Z-axis. The middle portion 106B is non-coplanar with the first outer portion 106A and second outer portion 106C. The middle portion 106B is disposed between the first aperture 130 and second aperture 132 and configured to define a first ion beam 112A and second ion beam 112B when the plasma 108 is present in the plasma chamber 109 and an extraction voltage is applied between the extraction plate and the substrate. The extraction plate 106 forms a first plasma meniscus 140 and a second plasma meniscus 142. These menisci have a curved 2D shape extending all the aperture length in X direction. They are a result of the electrostatic equilibrium between the plasma 108 and the external extraction electrostatic field and represent the border between the plasma 108 and a vacuum (not shown). The orientation, shape and area of the meniscus defines the natural angle the ion beam is extracted, the ion beam emissivity, and to some extent the ion beam current, respectively. The first outer portion 106A, the second outer portion 106C and the middle portion 106B define the extraction plate 106 and may be considered one single, electrically connected system and shown as three separate components by way of example. A plane 150 in FIG. 1A illustrates that the first outer portion 106A and the second outer portion 106C are coplanar to each other. The plane 150, or a "substrate plane" may also be parallel to a plane of the substrate 122. Vertical plane 152 illustrates a plane or line (or movement) that is perpendicular to the plane 150 along the Z-plane of FIG. 1A.

A hidden deflection electrode 102 is disposed adjacent to the middle portion 106B of the extraction plate 106 and outside of the plasma 108 located in the plasma chamber 109, and electrically isolated from the extraction plate 106. The hidden deflection electrode 102 may be deemed to be "concealed" from the plasma chamber 109 or from the plasma 108 when ions, such as the first ion beam 112A and the second ion beam 112B, that are extracted from the plasma 108 through the first plasma meniscus 140 or second plasma meniscus 142 do not strike the hidden deflection electrode.

More specifically, the hidden deflection electrode 102 may be deemed to be "hidden" from the plasma chamber because the extraction plate 106 screens the hidden deflection electrode 102. The hidden deflection electrode 102 is outside of the plasma chamber 109. The hidden deflection electrode is hidden, not because the hidden deflection electrode 102 is out of the line of sight from the plasma 108 through either of the apertures, such as the first aperture 130 and/or the second aperture 132, but because the hidden deflection electrode 102 is screened from the plasma 108 by the middle portion 106B of the extraction plate 106d. This is because the middle portion 106B is disposed between the plasma 108, or more specifically the plasma chamber 109, and the hidden deflection electrode 102 without the hidden deflection electrode 102 necessarily being out of line of sight of ions, such as first ion beam 112A and the second ion beam 112B, from the plasma 108. Thus, the hidden deflection electrode 102 may be considered all and/or partially "hidden" from the plasma 108.

A hidden deflection electrode power supply 115 applies a bias voltage to the hidden deflection electrode 102. The bias voltage is configured to at least one of a mean angle of incidence of ions and a range of angles of incidence centered around the mean angle in the first ion beam 112A and the second ion beam 112B. The bias voltage applied to the hidden deflection electrode 102, from the hidden deflection electrode power supply 115, is configured to independently control a first ion beam 112A and the second ion beam 112B. The hidden deflection electrode 102 is configured to move in a direction perpendicular to the middle portion 106B of the extraction plate 106. The electrode is small enough in Y and Z direction and its position relative to the extraction plate 106 is such that it is not hit by the ions when the first ion beam 112A and the second ion beam 112B are extracted even for highest bias voltages applied on it. In other words the hidden deflection electrode 102 is hidden behind the central part of the extraction optics. In brief, the hidden deflection electrode 102 may function to adjust the optics of extraction of the first ion beam 112A through the first aperture 130 and a second ion beam 112B through the second aperture 132. As illustrated in FIG. 1A, for example, when the hidden deflection electrode 102 is located proximate the middle portion 106B of the extraction plate and located proximately between the first aperture 130 and the second aperture 132. The first ion beam 112A ion and the second ion beam 112B may be extracted through the first aperture 130 and the second aperture 132 as two ion beams, such as the first ion beam 112A and the second ion beam 112B, which are different. The ion beams, such as the first ion beam 112A and the second ion beam 112B, which may consist of positive ions, are extracted when the plasma 108 is held at an elevated potential relative to the substrate 122. In a particular embodiment shown in FIG. 1A the plasma potential may be elevated by applying an extraction voltage to the extraction plate from the extraction power supply 114. The negative bias voltage applied to the hidden deflection electrode 102 is referenced to the extraction voltage applied to the extraction plate. i.e., the bias voltage is on the top of the extraction voltage. In another embodiment, the extraction plate is grounded and the hidden deflection electrode power supply 115 is referenced to the ground. In order to extract positive ions, in this case the substrate is held at a negative potential with respect to the ground by a power supply (not shown) electrically connected to the substrate holder.

Figure 1D:
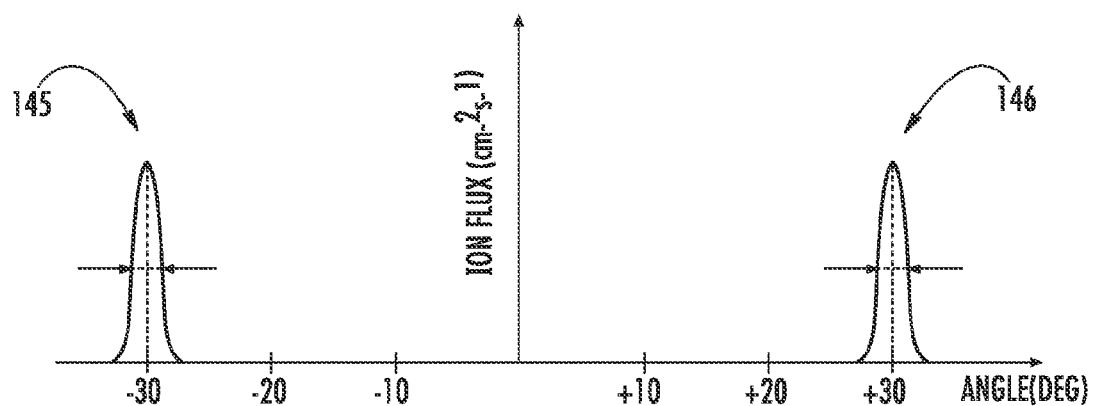
FIG. 1D presents another exemplary ion angular distribution.

In the present embodiments, the IAD of beamlets extracted from the plasma 108 may be varied by controlling bias applied to different components as detailed below. FIG. 1C and FIG. 1D provide exemplary IADs characteristic of a pair of ion beams that illustrate features of the ion beams that are controlled in the present embodiments.

By having the bias electrode, such as the hidden deflection electrode 102, outside the plasma 108, adjacent to an extraction aperture, and by using a bi-modal extraction geometry, i.e. splitting the extraction slit in two identical slits, two ion beamlets, such as the first ion beam 112A and the second ion beam 112B, can be extracted. The beamlets have symmetric incidence angles with respect to the normal on the substrate and identical angular spreads. Depending on the plasma density, z gap length, extraction voltage, and bias voltage values different ion angular distributions can be obtained at the wafer plane. Thus it is possible to obtain distribution with small incidence angles and large angular spread (135, 136) or distributions with big incidence angle and narrow angular spread (145, 146). Other combinations, i.e. small incidence angles small angular spread and big incidence angle and big spread are also possible. FIG. 1C shows an IAD in which the mean angle is +/−20 degrees and the full width at half maximum (FWHM) is 10 degrees, while FIG. 1D shows an IAD in which the mean angle is 30 degrees and FWHM is 2 degrees.

Because of the natural geometric angle of this configuration, ion angular distributions characterized by large mean angles may be obtained. When the plasma 108 is generated in the plasma chamber 109 and the extraction voltage is applied between the extraction plate and the substrate, the first plasma meniscus 140 forms between the first outer portion 106A and the edges of the middle portion 106B that define the first aperture 130. When the plasma 108 is generated in the plasma chamber 109 and the extraction voltage is applied between the extraction plate and the substrate, the second plasma meniscus 142 forms between the second outer portion 106C and the edges of the middle portion 106B that define the second aperture 132. The extraction plate 106 may be biased by an extraction power supply 114, and the hidden deflection electrode 102 may be biased by a separate, the hidden deflection electrode power supply 115 which is referenced to the extraction power supply. As described earlier, in one embodiment the substrate holder 121 which is electrically connected with the substrate 122 is held at ground potential. The potential difference between the plasma 108, which is at elevated potential and the substrate gives rise to formation of the first ion beam 112A and the second ion beam 112B which are directed at oblique incidence to the substrate 122, that is, along trajectories that forms a non-zero angle with respect to the Z-axis as shown. This oblique incidence may be useful for treating surfaces of features that may be aligned so their surfaces are not parallel to the X-Y plane. These kind of features are common for 3D semiconductor structures. In various embodiments, parameters such as the position of the hidden deflection electrode 102 relative to the extraction plate 106, z position of the substrate relative to the extraction plate 106, as well as voltages applied to different components of an extraction optics system may be adjusted to control, steer, vary, direct, and/or adjust the angle(s) of incidence and the angular spread of ion beam(s) directed to a substrate such as substrate 122.

In one embodiment, in order to generate the first ion beam 112A and the second ion beam 112B, both of which may be positive, having a desired energy at the substrate 122, the substrate holder may be biased negatively with respect to ground by a different power supply (not shown), while the plasma 108 is held at ground potential by connecting the extraction faceplate to the ground In various embodiments the substrate holder 121 may be coupled to a drive (not shown) that is configured to move the substrate holder 121 along a direction parallel to the Y-axis of the Cartesian coordinate system shown. In further embodiments, the substrate holder 121 may be movable along a direction parallel to the Z-axis. This provides the processing apparatus 100 with two degrees of freedom, i.e., allows relative position of the substrate 122 vs. the first aperture 130 and the second aperture 132 to be modified and allows the substrate 122 to be scanned with respect to the first aperture 130 and the second aperture 132 so that first ion beam 112A and the second ion beam 112B may be provided over the entirety of the surface of the substrate 122 in some instances.

In one embodiment, in the Y-direction, the first aperture 130 and the second aperture 132 are separated by a 20-50 millimeter (mm) middle portion defining a flat portion of the extraction plate 106. The hidden deflection electrode 102 is placed in front of this middle portion 106B and is non-coplanar with the middle portion 106B. In the Z-direction, the hidden deflection electrode 102 is disposed and located approximately 5-25 mm from the middle portion to prevent Paschen breakdown phenomena that may occur between the hidden deflection electrode 102 and the middle portion 106B. In the Y-direction, the top and bottom of the hidden deflection electrode 102 edges are shorter by 3-5 mm than the middle portion 106B to allow ion beam extraction without striking the hidden electrode.

By applying, a negative bias voltage on the hidden deflection electrode 102 the electrostatic potential distribution in the extraction areas of the first aperture 130 and the second aperture 132 are altered. Thus, for a given extraction voltage, z gap length and plasma density (set by the gas pressure and rf power) depending on the value of the bias voltage, the ion beams, such as the first ion beam 112A and the second ion beam 112B, are bent or curved towards or away from the hidden deflection electrode 102, and consequently the ion angular distributions of the first ion beam 112A and the second ion beam 112B are varied. The ion beams, such as the first ion beam 112A and the second ion beam 112B, leave the first aperture 130 and the second aperture 132 with relatively low kinetic energy because the ions cross the meniscus with Bohm velocity $$K = m_i V_B^2 / 2. \quad (1)$$

where $m_i$ is the ion mass and $v_B$ is Bohm speed (ion acoustic velocity) given by the equation:

$$V_B = \sqrt{k_B T_e / m_i} \quad (2)$$

with $k_B$ is the Boltzmann constant, $T_e$ is the electron temperature. Thus, being located very close to the first aperture 130 and the second aperture 132, the bias voltage applied on the hidden deflection electrode 102 effectively tailors the electrostatic potential topology in the extraction area and implicitly shapes ion angular distribution (IAD) of the first ion beam 112A and the second ion beam 112B.

The size, shape, location and orientation of hidden deflection electrode 102 is such that the ion beams, such as the first ion beam 112A and the second ion beam 112B, that are extracted from the plasma 108 cannot reach the hidden deflection electrode 102 even for most unfavorable combination of highest negative bias voltage applied to the hidden deflection electrode 102 coupled with lowest extraction voltage. In the absence of the ion beams, such as the first ion beam 112A and the second ion beam 112B, striking the hidden deflection electrode 102, no sputtering effects will take place. The potential difference between the plasma 108 and plasma chamber 109, such as a wall of the plasma chamber 109, and extraction plate 106 is usually on the order of few volts which is below the sputtering threshold. In this fashion, the detrimental effect of particle generation is mitigated but in situ control of the IAD still maintained.

FIG. 1E presents an exploded cross-section view of the ion extraction region of processing apparatus of FIG. 1A. consistent with embodiments of this disclosure. It should be noted FIG. 1E is a partial cross sectional view of FIG. 1A and any reference in FIG. 1E equally applies to the entire portion of FIG. 1A. For example, if a reference is directed to the first ion beam 112A, the same description and reference may apply to the second ion beam 112B. As illustrated, the hidden deflection electrode 102 is disposed adjacent to the middle portion 106B of the extraction plate 106 and concealed from the plasma 108 located in the plasma chamber 109. The hidden deflection electrode 102 is electrically isolated from the extraction plate 106. The hidden deflection electrode power supply 115 applies a bias voltage to the hidden deflection electrode 102. The bias voltage that maybe applied to the hidden deflection electrode 102 is configured to vary at least one of a mean angle of incidence of ions and a range of angles of incidence centered around the mean angle in the first ion beam 112A and the second ion beam 112B. The bias voltage applied to the hidden deflection electrode 102, from the hidden deflection electrode power supply 115, is configured to independently control a first ion beam 112A and/or the second ion beam 112B.

As more clearly illustrated in FIG. 1E, at the same time when a substrate (not shown in FIG. 1E) is biased with respect to the plasma 108 an electric fields develop between the plasma 108 and substrate, giving rise to a plasma meniscus, such as the second plasma meniscus 142, which is formed between edges of the middle portion 106B and edges of the second outer portion 106C. Also, a plasma meniscus, such as the first plasma meniscus 140, is formed between edges of the middle portion 106B and edges of the first outer portion 106A as depicted in FIG. 1A. When a bias voltage is applied to the hidden deflection electrode 102 the shape of the electric fields between the plasma 108 and substrate may be altered, including in the region generally shown as the extraction region 153 near the second plasma meniscus 142 and hidden deflection electrode 102. This change in electric field shape may result in a change of the mean angle of incidence as well as the angular spread of ions in the first ion beam 112A, as detailed below.

FIGS. 2A-2C depict the operation scenarios for the processing apparatus of FIG. 1A and illustrate beamlets, shapes, and electrostatic potential distributions in the extraction area for 2 kV extraction voltage and bias voltages of 0, −200, and −400 Volts. FIGS. 2A-2C depict three operation scenarios for processing apparatus 100 in which a pair of ion beams, such as the first ion beam 112A and the second ion beam 112B, are extracted from the plasma 108 under a first set of conditions. For simplicity it may be assumed that ions within each of the ion beams, such as the first ion beam 112A and the second ion beam 112B, form a same mean angle with respect to perpendicular to the substrate 122 and form the same angular range of angles of incidence, where a mean angle is defined by the absolute value of the angle with respect to perpendicular on the substrate unless otherwise noted. Thus, an angle +θ with respect to perpendicular on the substrate surface (the Z-axis direction) and an angle −θ with respect to perpendicular on the substrate surface may be deemed to constitute the same mean angle. As further shown in FIGS. 2A-2C, the edges of the middle portion 106B and edges of first outer portion 106A and second outer portion 106C may be bent so as to define an aperture plane that forms a non-zero angle with respect to a substrate plane (see plane 150 of FIG. 1). In other words, a first aperture 130 and a second aperture 132 are arranged to define a respective first aperture plane and a second aperture plane (e.g., respective aperture planes) that each forms a non-zero angle with respect to a plane of the substrate. In this manner, the ion beams, such as the first ion beam 112A and the second ion beam 112B, tend to form a non-zero angle with respect to the vertical plane 152 when extracted through the first aperture 130 and the second aperture 132.

Also, applicable to FIGS. 2A-2C the same extraction voltage of 2 kilovolts (kV) is applied to the first outer portion 106A, the second outer portion 106C and the middle portion 106B of the extraction plate 106.

FIG. 2A presents exemplary illustration of the extraction geometry of using the hidden deflection electrode 102 for controlling, steering, and adjusting the ion angular distributions of the ion beams, such as the first ion beam 112A and the second ion beam 112B, which may represent the angular distributions of the pair of ion beams, such as the first ion beam 112A and the second ion beam 112B, when a zero (0V) bias voltage is applied to the hidden deflection electrode 102. FIG. 2B presents exemplary illustration of the extraction geometry of using the hidden deflection electrode 102 for controlling, steering, and adjusting the ion angular distributions of the ion beams, such as the first ion beam 112A and the second ion beam 112B, which may represent the angular distributions of the pair of the ion beams, such as the first ion beam 112A and the second ion beam 112B, when a negative 200 (−200V) bias voltage is applied to the hidden deflection electrode 102. FIG. 2C presents exemplary illustration of the extraction geometry of using the hidden deflection electrode 102 for controlling, steering, and adjusting the ion angular distributions of the ion beams, such as the first ion beam 112A and the second ion beam 112B, which may represent the angular distributions of the pair of the ion beams, such as the first ion beam 112A and the second ion beam 112B, when a negative 400 (−400V) bias voltage is applied to the hidden deflection electrode 102.

The extraction geometry with hidden deflection electrode 102 of ion beams, such as the first ion beam 112A and the second ion beam 112B, shown in FIG. 2A includes the plasma chamber 109 which is held at ground potential and the substrate 122 which is at high negative potential (the desired ion beam energy). An inverse approach may be applied, where the plasma chamber 109 is at high positive potential and the substrate 122 is held at ground potential is valid as well. What matters for the ion extraction optics is just the potential difference (voltage) between the plasma chamber 109 and the substrate 122. FIG. 2A illustrates the extracted ion beams, such as the first ion beam 112A and the second ion beam 112B, shape and the electrostatic equipotential lines 220 in the inter-electrode gap. In the extraction area, defined by the first aperture 130 and the second aperture 132, the middle portion 106B has an inward bend or curve (toward the plasma 108) to allow extraction slits be oriented symmetrically at a predetermined angle. This geometry allows the ion beams, such as the first ion beam 112A and the second ion beam 112B, to be extracted at "natural" tilting angles +θ or −θ with respect to the normal on the substrate 122 plane (z-axis). FIGS. 2B and 2C illustrate the extracted ion beams, such as the first ion beam 112A and the second ion beam 112B, shape and the electrostatic equipotential lines 220 for increasing absolute value of the bias voltage on the hidden deflection electrode 102. The effect of increased bias voltage is wider separation of equipotential lines which means a weaker electrostatic potential gradient (electric field) in the extraction area. This fact affects both ion mean angle of incidence and angular spread of the extracted ion beams.

Figure 3A:
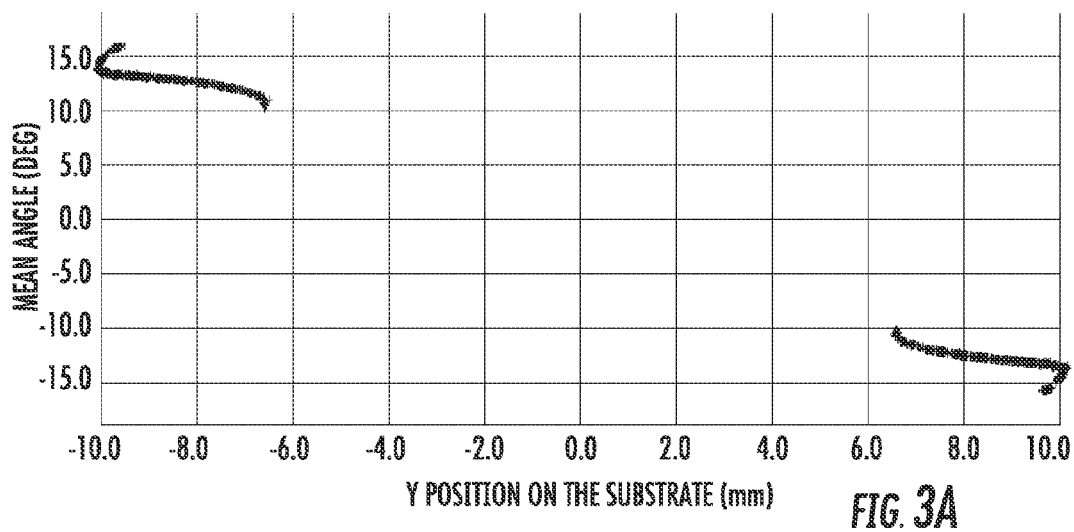
FIGS. 3A-3C present modeling results of the ion beam emissivity for the processing apparatus of FIG. 1A and operation scenarios of FIG. 2A-2C.
Figure 3B:
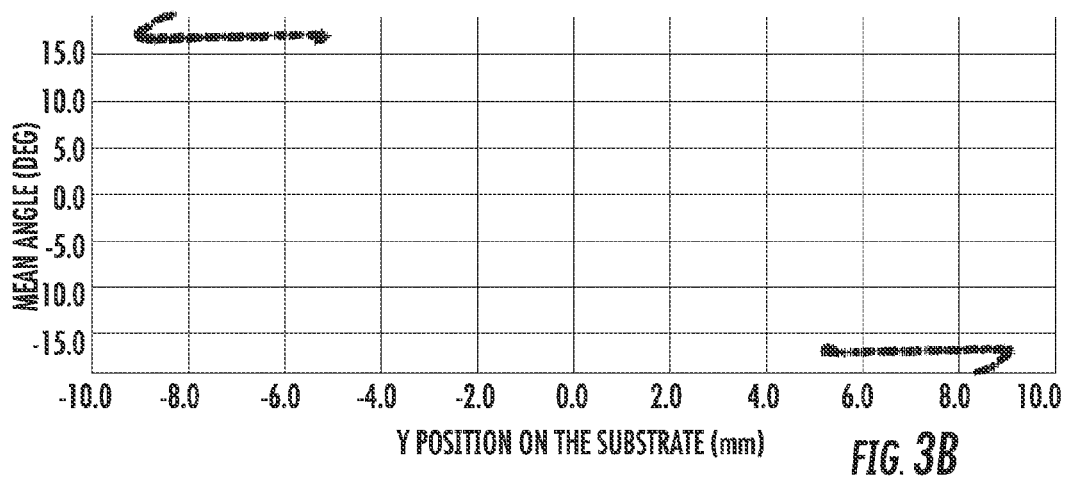
Figure 3C:
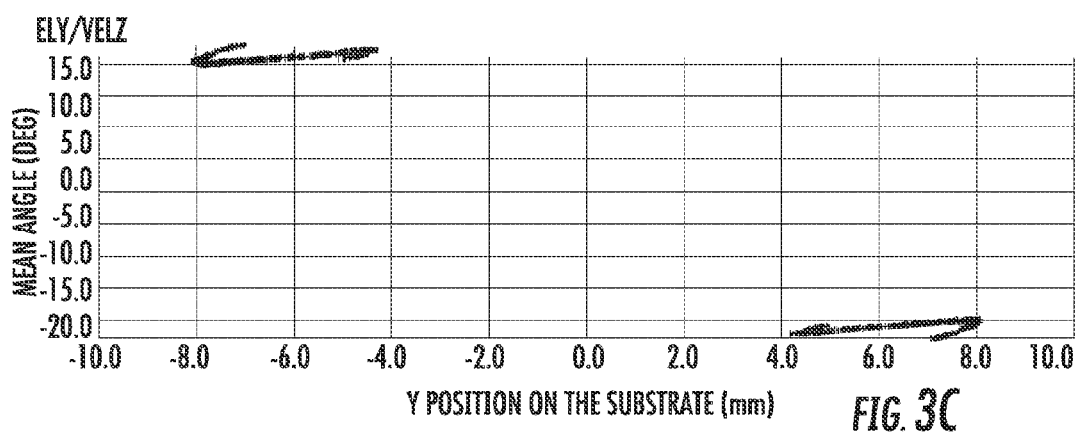

FIGS. 3A-3C presents exemplary symmetrical emissivity curves (which depict angle vs. position at the substrate surface) for a pair of ion beams, such as the first ion beam 112A and the second ion beam 112B, which are symmetric, for the three test operations of FIGS. 2A-2C. The plots in FIGS. 3A-3C illustrate how the beam emissivity at the substrate surface changes for a 2 kV extraction voltage and 0V, −200V, and −400V bias voltages applied on the hidden deflection electrode 102. Because of the symmetry of the geometry of the extraction optics, the emissivity curves are symmetric as well, i.e., symmetric angles and symmetric locations on the substrate surface. FIG. 3A depicts the ion beams, such as the first ion beam 112A and the second ion beam 112B, emissivities, i.e., the angular beam characteristics versus beam position in the Oy direction at the substrate surface for a zero (0) bias voltage applied to the hidden deflection electrode 102. As can be seen most of the ions in the beams 112 hit the surface of the substrate 122 with an angle between 10 and 17 degrees, which results in a mean angle of ~14 degrees and an angular spread of ~2 degrees. The beams are separated on the substrate surface by 17 mm and their footprint on the substrate surface is approximately 3 mm. The orientation of the ion beams, such as the first ion beam 112A and the second ion beam 112B, emissivity curves shows the ion beams, such as the first ion beam 112A and the second ion beam 112B, are convergent.

FIG. 3B depicts the ion beams, such as the first ion beam 112A and the second ion beam 112B, emissivities, i.e., the angular beam characteristics versus beam position in the Oy direction for a (−200 V) bias voltage applied to the hidden deflection electrode 102. As can be seen most of the ion beams, such as the first ion beam 112A and the second ion beam 112B, hit the surface of the substrate 122 with an angle between of ~17 degrees. The beams are separated on the substrate surface by 14 mm and their footprint on the substrate surface is approximately 3 mm. The orientation of the ion beams, such as the first ion beam 112A and the second ion beam 112B, emissivity curves shows the ion beams, such as the first ion beam 112A and the second ion beam 112B, are parallel which means zero divergence.

FIG. 3C depicts the ion beams, such as the first ion beam 112A and the second ion beam 112B, emissivities, i.e., the angular beam characteristics versus beam position in the Oy direction for a (−400 V) bias voltage applied to the hidden deflection electrode 102. As can be seen most of the ions in the beams 112 hit the surface of the substrate 122 with an angle between 20-23 degrees, which results in a mean angle of approximately ~21 degrees and an angular spread of ~2 degrees. The beams are separated on the substrate surface by 12 mm and their footprint on the substrate surface is approximately 4 mm. The orientation of the ion beams, such as the first ion beam 112A and the second ion beam 112B, emissivity curves shows the ion beams, such as the first ion beam 112A and the second ion beam 112B, are slightly divergent.

Figure 4A:
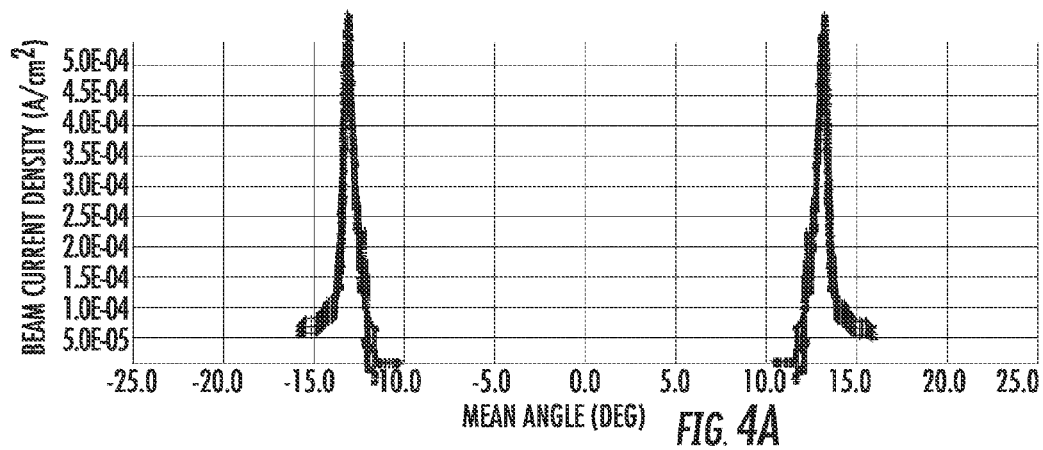
FIGS. 4A-4C depict ion angular distributions for the processing apparatus of FIG. 1A and operating scenarios shown in FIGS. 2A-2C.
Figure 4B:
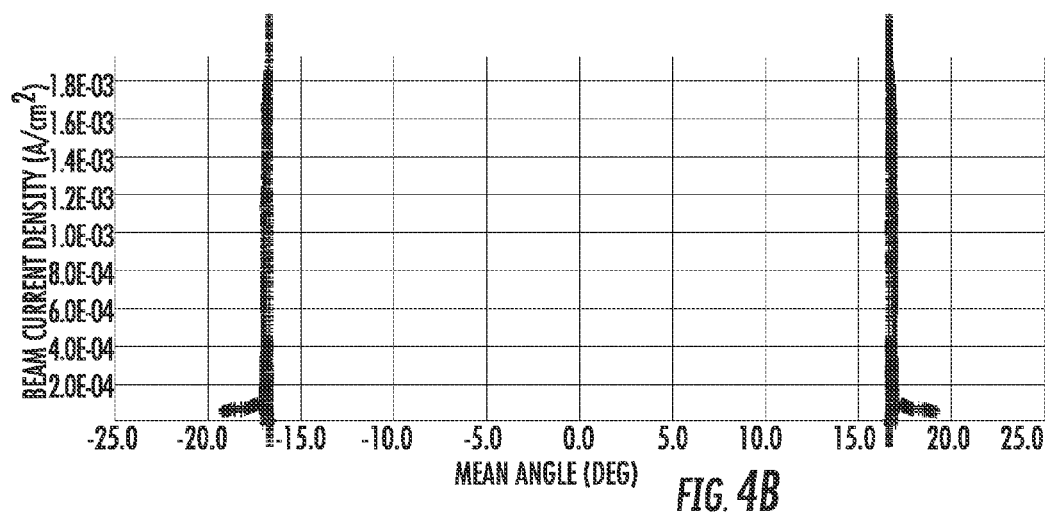
Figure 4C:
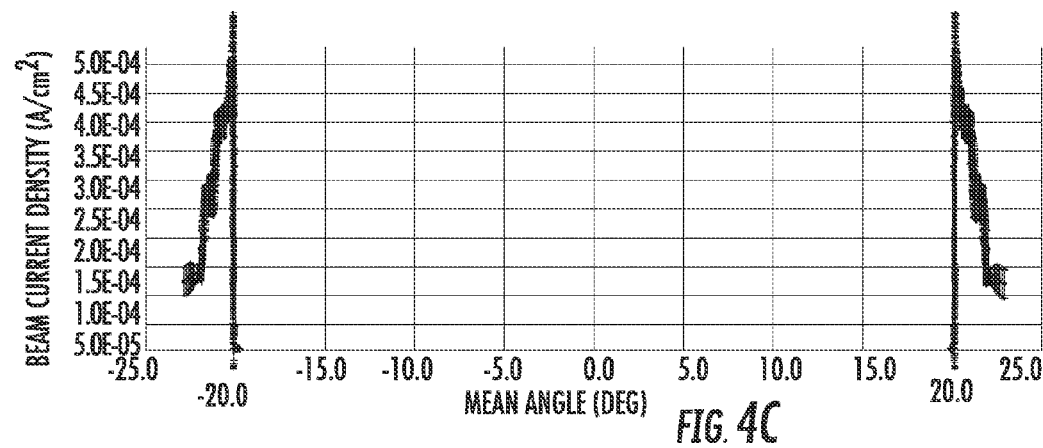

FIGS. 4A-4C depict modeling results of the ion angular distributions for the identical extraction voltage (2 kV) and the bias voltages corresponding to the three operation scenarios in FIGS. 2A-2C. FIG. 4A shows the ion current density distribution with most of the ions in the beams 112 hitting the surface of the substrate 122 with an angle between 10 and 17 degrees, which results in a mean angle of ~14 degrees and an angular spread of ~2 degrees. FIG. 4B shows the ion current density distribution with most of the ions in the beams 112 hitting the surface of the substrate 122 with an angle of ~17 degrees. For this case the angular spread is very small, below a fraction of degree. FIG. 4C shows the ion current density distribution with most of the ions in the beams 112 hitting the surface of the substrate 122 with an angle between 20 and 23 degrees, which results in a mean angle of ~21 degrees and an angular spread of ~2 degrees. FIGS. 4A-4C illustrate that for the geometry shown in FIG. 1A, and for a given extraction voltage (in this case 2 kV), the mean angle can be varied from 10° to 22° by varying the bias voltage from 0 V to −400 V. Larger angles are also possible by adjusting accordingly the plasma density and extraction voltage, and/or by adjusting the position of the hidden deflection electrode 102.

Figure 5A:
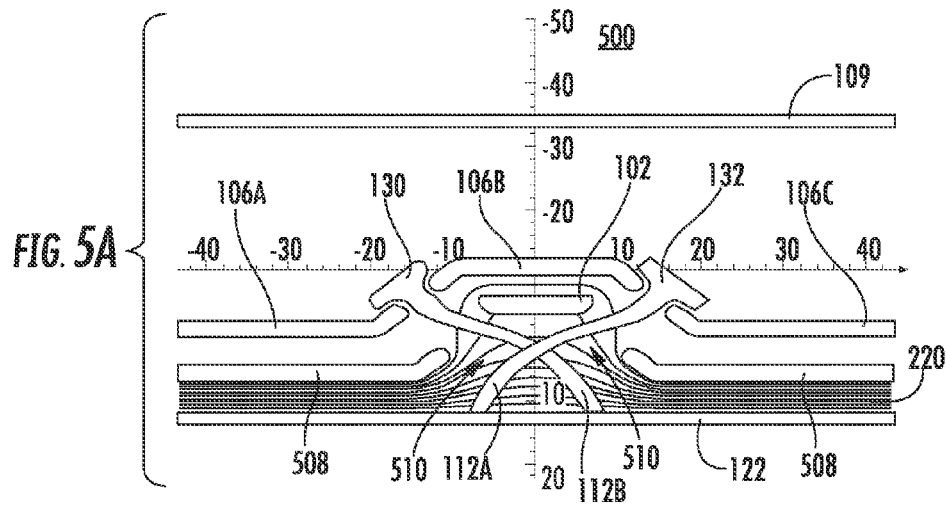
FIGS. 5A-5C presents electrode arrangement, beamlets shapes and electrostatic potential distributions for three different operating scenarios of the processing apparatus having a hidden deflection electrodes and a focusing electrode consistent with various embodiments of the processing apparatus of FIG. 1A.
Figure 5B:
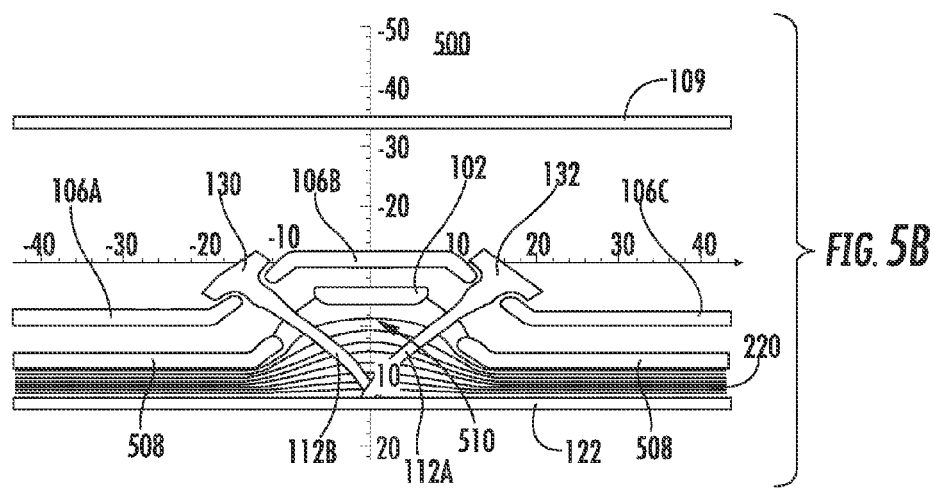
Figure 5C:
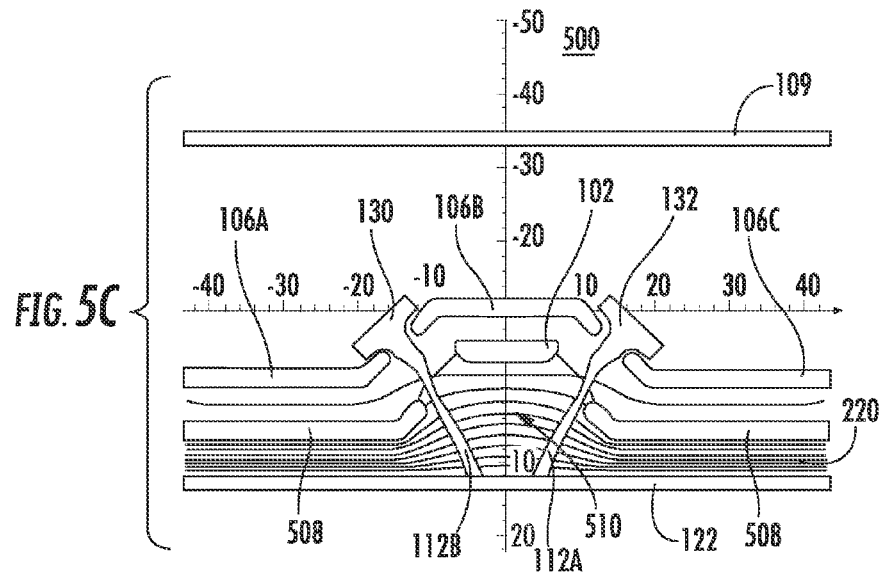

FIGS. 5A-5C presents block diagram of a processing apparatus 500 with an ion implanter having a hidden deflection electrode 102 and a hidden focusing electrode 508 consistent with various embodiments of the disclosure. Since some precision material modification (PMM) applications require an independent control of IAD characteristics, i.e., orthogonal control of mean angle and angular spread, introducing a second bias-able electrode (e.g., the hidden focusing electrode 508) between the extraction plate 106 and the substrate 122 provides for a focusing effect, or "fine tuning" of the mean angle and angular spread of the ion beams, such as the first ion beam 112A and the second ion beam 112B, FIGS. 5A-5C, illustrates three operation scenarios of the processing apparatus 100 using an identical extraction voltage (2 kV) and different combination of bias voltages and focusing voltages. In FIGS. 5A-5C, the hidden focusing electrode 508 is disposed adjacent to the hidden deflection electrode 102 outside of the plasma chamber 109, and electrically isolated from the extraction plate 106 and the hidden deflection electrode 102. In one embodiment, the hidden focusing electrode 508 includes a third aperture 510 disposed adjacent to the middle portion 106B. The third aperture 510 is configured to allow the ion beams, such as the first ion beam 112A and the second ion beam 112B, illustrated in FIG. 1A to pass through the third aperture 510.

In one embodiment, a second hidden focusing electrode power supply (not shown) applies a second bias voltage to the hidden focusing electrode 508 for focusing, adjusting, and/or fine tuning the ion beams, such as the first ion beam 112A and the second ion beam 112B, and the second hidden focusing electrode power supply is also referenced to the extraction power supply 114. The second bias voltage applied to the hidden focusing electrode 508 focuses or adjusts both the shape and angular characteristics of the first ion beam 112A and the second ion beam 112B. The hidden focusing electrode 508 may be placed between the extraction plate 106 and the substrate 122 and is independently biased of the hidden deflection electrode 102 but on the top of the extraction voltage. By varying the voltage on the hidden focusing electrode 508 the topology of the electrostatic equipotential lines 220 in the extraction area is changed and thus the IAD of the ion beams, such as the first ion beam 112A and the second ion beam 112B, extracted through the first aperture 130 and the second aperture 132 of the extraction plate 106 is altered.

In conjunction with the hidden deflection electrode 102, when the hidden focusing electrode 508 is biased, the hidden focusing electrode 508 brings a focusing effect on the ion beams, such as the first ion beam 112A and the second ion beam 112B, that are extracted from the plasma chamber 109 and consequently the resultant angular spread will be tighter or the ion angular distribution more focused. Moreover, in one embodiment, focusing effects for positive bias may be also be obtained. Thus, the hidden focusing electrode 508 acts as a focusing electrode, narrowing the range of angles of incidence centered around the mean angle in the first ion beam 112A and the second ion beam 112B (see FIG. 1A). The hidden focusing electrode 508 also assists the hidden deflection electrode 102 in the controlling, steering, focusing, and/or guiding the direction of the ion beams, such as the first ion beam 112A and the second ion beam 112B. In one embodiment, the hidden deflection electrode 102 and the hidden focusing electrode 508 are interoperative to adjust the range of angles of incidence and the mean angle of incidence independently of one another.

In FIG. 5A using an extraction voltage of 2 kV, a bias voltage of −400 V and a focusing voltage of 0 V, the topology of the electrostatic equipotential lines 220 in the extraction area is such that the ion beams, such as the first ion beam 112A and the second ion beam 112B, cross over each other just prior intersecting the surface of the substrate 122. In FIG. 5B using the same extraction voltage 2 kV but a bias voltage of −200 V and a focusing voltage of −200 V, the topology of the electrostatic equipotential lines 220 is changed so that less focusing occurs and the ion beams intersect each other on the substrate surface. In FIG. 5C using the same extraction voltage of 2 kV but a bias voltage of 0 V and a focusing voltage of −400 V, the electrostatic potential distribution is altered so that the electrostatic equipotential lines 220 are less curved which produce less focusing. The hidden deflection electrode 102 and the hidden focusing electrode 508 steer the direction of the ion beam such that the ion beams, such as the first ion beam 112A and the second ion beam 112B, will virtually intersect at a position located behind the substrate.

Figure 6A:
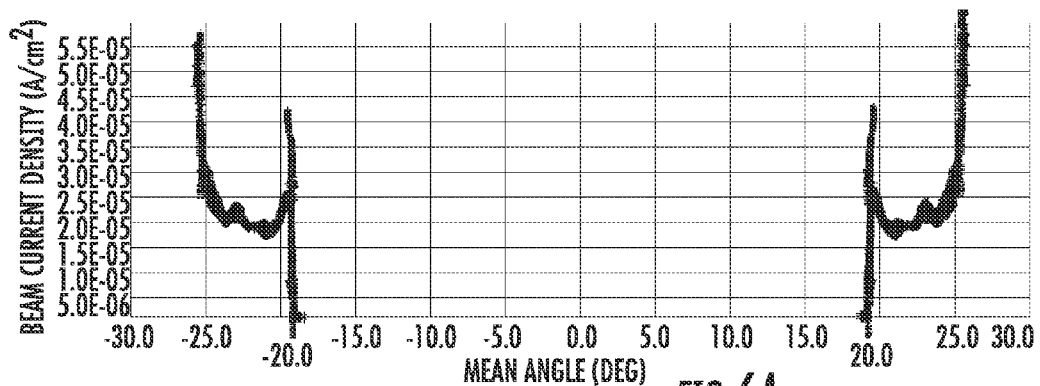
FIGS. 6A-6C present modeling results of the ribbon ion beam angular distribution at the wafer plane for various combinations of bias voltages on the hidden deflection and focusing electrodes for the system FIGS. 5A-5C.
Figure 6B:
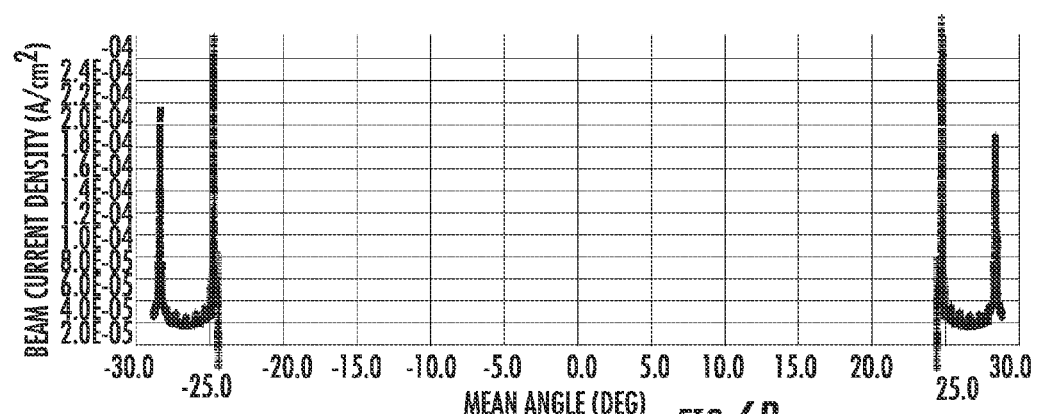
Figure 6C:
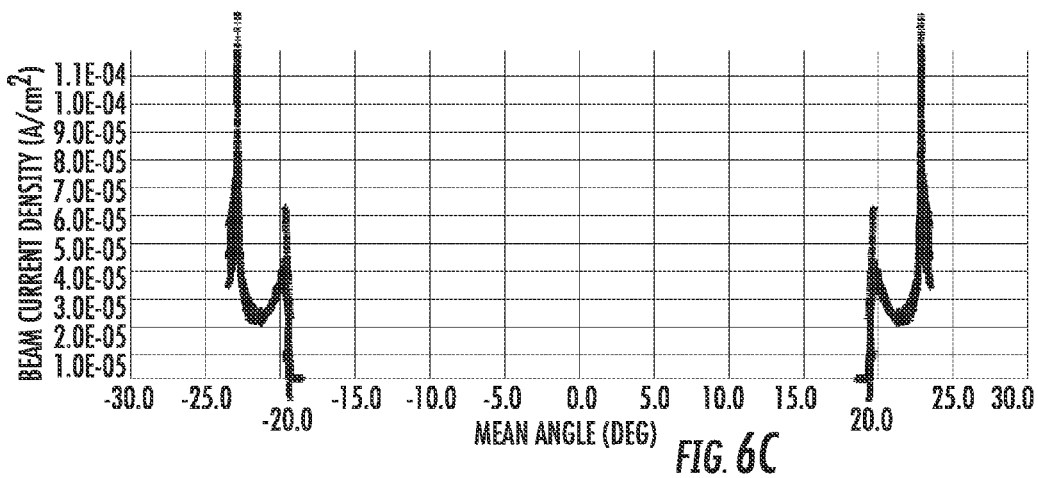

FIGS. 6A-6C depicts modeling results of the ion angular distributions for the identical extraction voltage of 2 kV and the bias voltages and focusing voltages corresponding to the three operation scenarios presented in FIGS. 5A-5C. FIGS. 6A-6C present modeling results of the ion angular distribution on the surface of the substrate 122 for various bias voltages on the hidden deflection electrode 102 and the hidden focusing electrode 508 for the system described in FIGS. 5A-5C. More specifically, FIG. 6A illustrates the surface of the substrate 122 being exposed to an identical angular symmetric ion distributions given by a bias voltage of −400 V on the hidden deflection electrode 102 and 0 V on the focusing electrode. FIG. 6B illustrates the surface of the substrate 122 being exposed to different angular symmetric ion distributions given by a bias voltage of −200 V on the hidden deflection electrode 102 and 0 V on the focusing electrode. FIG. 6C illustrates the surface of the substrate 122 being exposed to different angular symmetric ion distributions given by a bias voltage of 0 V on the hidden deflection electrode 102 and −400 V on the focusing electrode.

As shown in FIG. 6A, for the combination of the biasing voltage of −200 V and a focusing voltage of 0 V on the hidden deflection electrode 102 and the hidden focusing electrode 508, most of the ions in the beams 112 hit the surface of the substrate 122 with an angle between 19 and 25 degrees. The ion angular distribution of the ion beams, such as the first ion beam 112A and the second ion beam 112B, is broad, with the ion angular distribution width spanning ~6 degrees. As illustrated in FIG. 6B, when the bias voltage remains fixed to −200V and the focusing voltage is decreased to −200V, most of the ions in the beams 112 hit the surface of the surface of the substrate 122 with an angle between 24 and 29 degrees. The ion angular distribution of the ion beams, such as the first ion beam 112A and the second ion beam 112B, is narrower, in other words tighter and more focused, with the ion angular distribution width spanning ~5 degrees.

As illustrated in FIG. 6C, when the bias voltage is 0V and the focusing voltage is at to −400V, most of the ions in the beams 112 hit the surface of the surface of the substrate 122 with an angle between 20 and 24 degrees. Although broad, the ion angular distribution of the ion beams, such as the first ion beam 112A and the second ion beam 112B, in this case is more narrow, with the ion angular distribution width spanning ~4 degrees.

In ion etching applications, an undesired phenomenon consists in streaming back toward the source atoms and molecules of the etched material of the processed substrate. These atoms and molecules can travel to the plasma source where they might deposit on the walls and/or extraction slit edges changing the plasma 108 and extracted ion beam characteristics. From this point of view, another advantage brought by the hidden focusing electrode 508 is that it drastically reduces the amount of material that might stream back. Although line-of-sights between the first aperture 130 of the extraction plate 106 and the substrate 122 and the second aperture 132 and the substrate 122 exist the solid angle seen by each aperture is extremely small. As a result most of the material that is etched from the substrate 122 will deposit on the hidden focusing electrode 508 and will not travel back to the plasma chamber 109.

In one embodiment, the processing apparatus 100 also provides additional benefits to productivity aspects by using the hidden deflection electrode 102 and/or the hidden focusing electrode 508. For example, because of the ion induced damage many semiconductor plasma processes require low ion energy. According to Child-Langmuir law for the type of ion extraction shown in FIG. 2 the extracted ion beam current is space-charge limited:

$$j = \frac{4\varepsilon_0}{9}\left(\frac{2e}{m_i}\right)^{\frac{1}{2}}\left(\frac{V^{\frac{3}{2}}}{d^2}\right). \quad (3)$$

where j is beam current density, $\varepsilon_0$ is dielectric permittivity of vacuum, e has the usual meaning of elementary charge, $m_i$ is ion mass, d is inter-electrode gap length (in this case the extraction plate 106—substrate 122 gap), and V is the extraction voltage. Thus it is possible that for extraction voltages below 1 kV the amount of the ion beams, such as the first ion beam 112A and the second ion beam 112B, total current that is extracted to be below few mA making the system uncompetitive from productivity point of view.

Figure 7A:
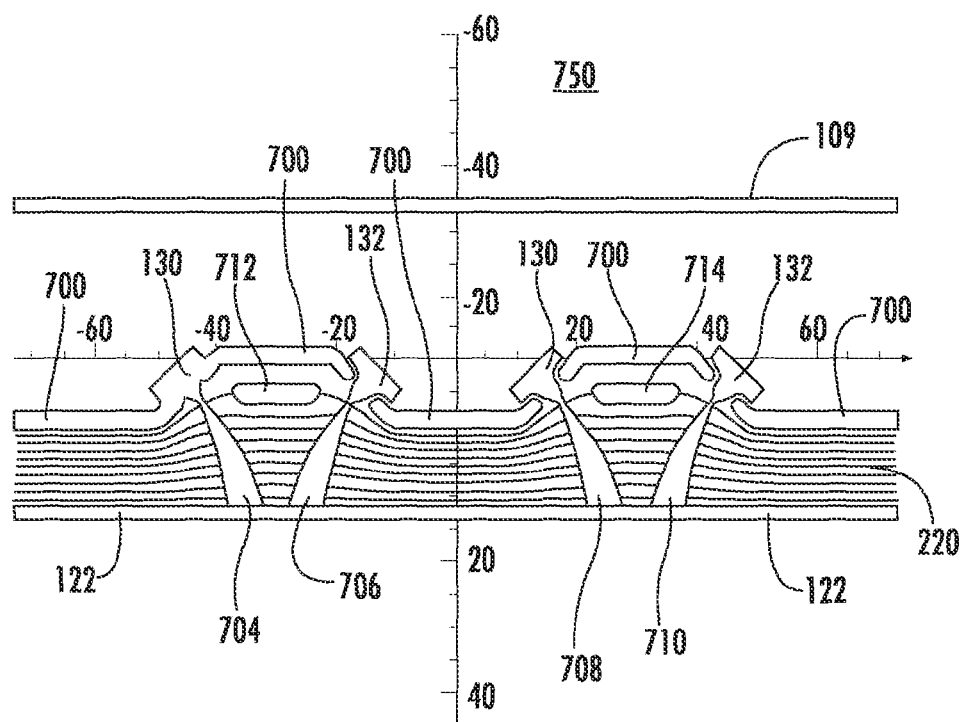
FIGS. 7A-7B presents electrode arrangement, beamlets shapes and electrostatic potential distributions of an ion implanter having multiple hidden deflection electrodes with extraction geometries consistent with various embodiments of the processing apparatus of FIG. 1A.
Figure 7B:
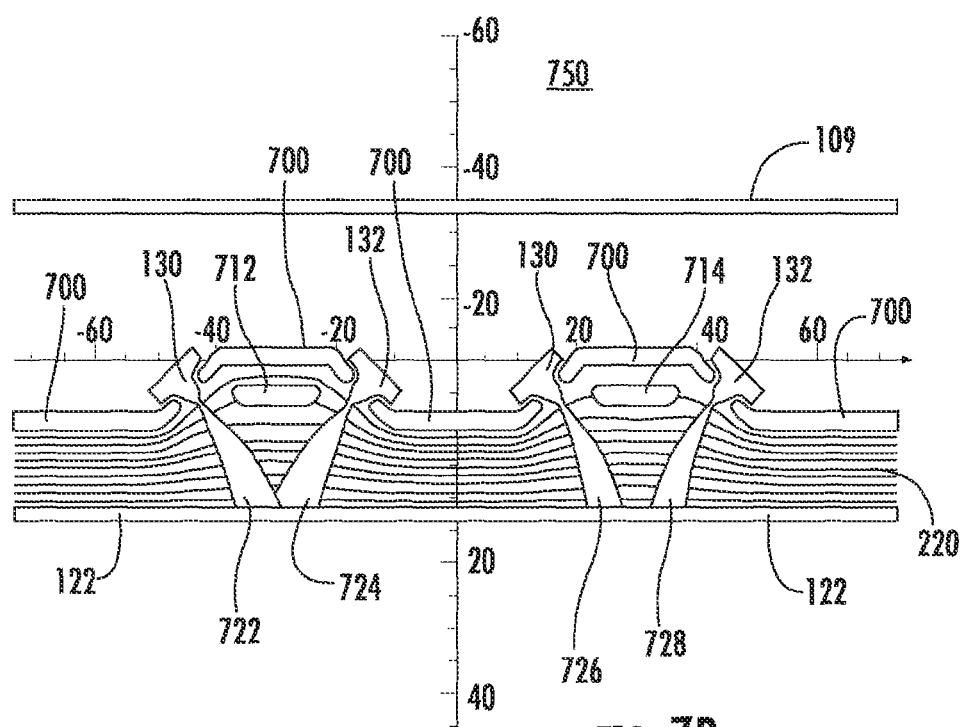

To compensate for any ion beam current limitation, in one embodiment, a processing apparatus extraction system may include multiple extraction optics. FIGS. 7A-7B depict an embodiment of a processing apparatus 750 in which an extraction plate 700 is provided with multiple pairs of extraction apertures, such as the first aperture 130 and the second aperture 132, that are associated with respective multiple hidden deflection electrodes, such as hidden deflection electrode 712 and hidden deflection electrode 714. In the particular illustration of FIGS. 7A and 7B a quad extraction system having four extraction slits (2×2 symmetrical) is shown, where the extraction are shown as a first aperture 130 and a second aperture 132 for each hidden deflection electrode. In an alternative embodiment, the geometries for the multiple hidden deflection electrodes, such as hidden deflection electrode 712 and hidden deflection electrode 714, may be used in a variety of symmetrical slits, such as, for example, in a 6, 8, 10, and so forth type symmetrical slits.

FIG. 7A illustrates a processing apparatus 750 with a configuration in which a first pair of ion beams, ion beam 704 and ion beam 706, has identical IAD to that of a second pair of ion beams, ion beam 708 and ion beam 710. This may be accomplished by applying the same electrostatic potential (voltage) to the hidden deflection electrode 712 as that applied to hidden deflection electrode 714.

FIG. 7B illustrates a processing apparatus 750 with a configuration in which a first pair of ion beams, ion beam 722 and ion beam 724, has a different IAD as compared to that of a second pair of ion beams, ion beam 726 and ion beam 728. This may be accomplished by coupling the hidden deflection electrode 712 to a first voltage supply and the hidden deflection electrode 714 to a second voltage supply, so that a different voltage may be applied to the hidden deflection electrode 712 in comparison to that applied to the hidden deflection electrode 714.

Consistent with various embodiments, the amount of ion current of the first ion beam 112A and the second ion beam 112B (FIG. 1A) extracted from the plasma chamber 109 may be varied by varying the local plasma density, the separation distance between each hidden deflection electrode 102, and the extraction voltage. The electrostatic equipotential lines 220 follow similar patterns for each hidden deflection electrode 102 if the bias voltage is the same but may be different if the bias voltages applied to each hidden deflection electrode 102 are different. Depending on the application, such multiple extraction optics may be designed in such a fashion that the ion beams extracted through each slit may carry identical amount of current and may have identical ion angular distributions as shown in FIG. 7A. In another embodiment shown in FIG. 7B, the substrate 122 may be exposed to different symmetric ion angular distributions. This may be advantageously applied for processing 3D structures vertical surfaces. For example, as the substrate 122 is scanned in front of the extraction optics along a direction parallel to the Y-axis, an elongated portion of the substrate 122 along a direction parallel to the X-axis may be first exposed to ion beams having high mean angle of incidence (with respect to the Z-axis), which may allow the ion beam to process for instance the side walls of a trench (not shown) in the substrate 122 that are oriented along the Z-axis). As the substrate 122 continues the scanning along the Y-axis, the same elongated portion of the substrate 122 may be exposed to ion beams having small mean angles of incidence with respect to the Z-axis, which allows ions to strike the bottom of the same trenches whose sidewalls are oriented parallel to the Z-axis.

Figure 8A:
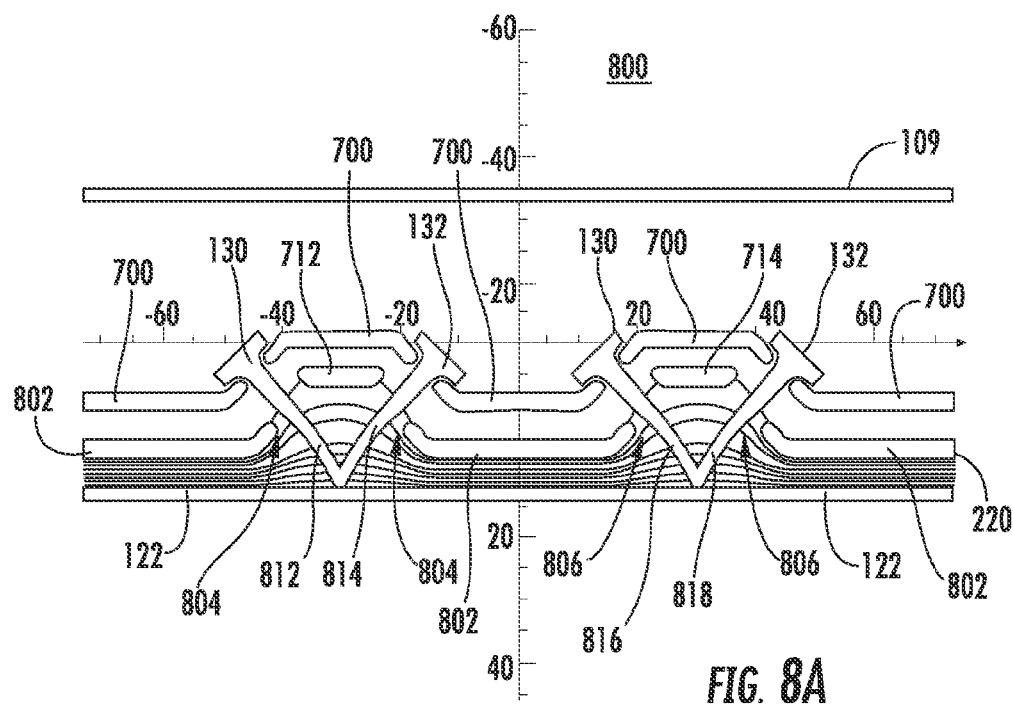
FIGS. 8A-8B presents electrode arrangement, beamlets shapes and electrostatic potential distributions of an ion implanter having a multiple hidden deflection electrodes and a focusing electrode consistent with various embodiments of the processing apparatus of FIG. 1A.
Figure 8B:
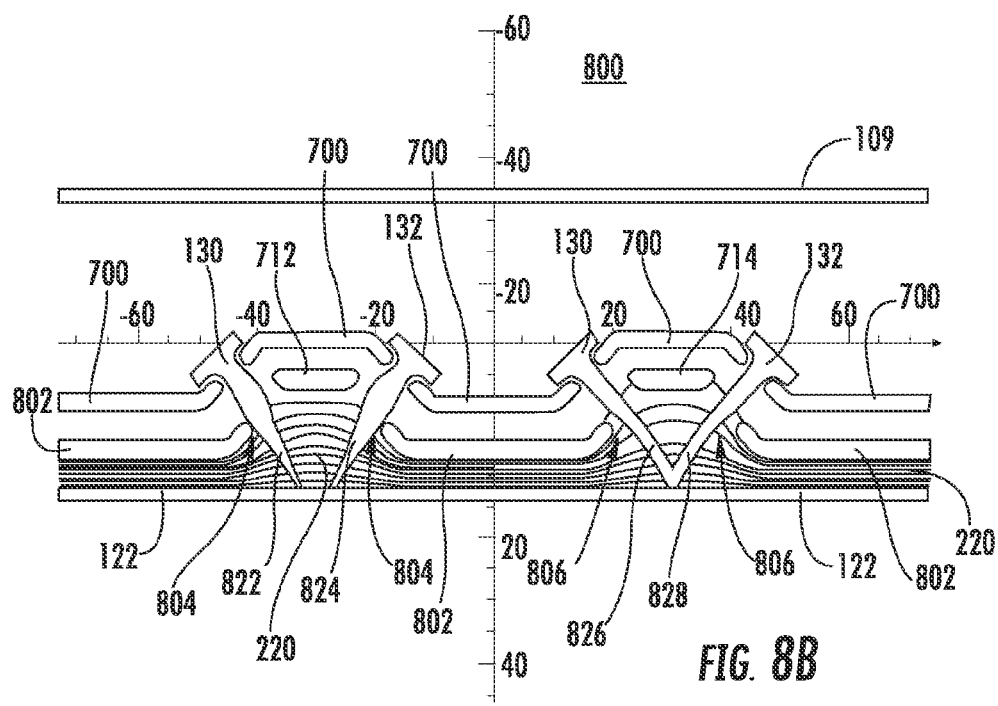

FIGS. 8A-8B illustrate embodiments in which a processing apparatus 800 includes multiple hidden deflection electrodes and a multi-aperture hidden focusing electrodes that includes multiple apertures to accommodate multiple pairs of ion beams. In one embodiment as illustrated generally in FIGS. 8A and 8B, multiple hidden deflection electrodes and a multi-aperture hidden focusing electrode are arranged in concert with four extraction slits (2×2 symmetrical) provided in an extraction plate 700. As illustrated a first aperture 130 and a second aperture 132 are provided for each hidden deflection electrode, hidden deflection electrode 712 and hidden deflection electrode 714. A multi-aperture hidden focusing electrode 802 is arranged with an aperture that is termed a focusing electrode aperture 804, and is arranged to accommodate a first pair of ion beams, ion beam 812 and ion beam 814. The multi-aperture hidden focusing electrode 802 is arranged with a second focusing electrode aperture 806 to accommodate a second pair of ion beams, ion beam 816 and ion beam 818. A multi-aperture hidden focusing electrode 802 may also be arranged with an aperture that is termed a focusing electrode aperture 804, and is arranged to accommodate a first pair of ion beams, ion beam 822 and ion beam 824. The multi-aperture hidden focusing electrode 802 is arranged with a second focusing electrode aperture 806 to accommodate a second pair of ion beams, ion beam 826 and ion beam 828.

In alternative embodiments, the geometries for multiple hidden deflection electrodes and multi-aperture hidden focusing electrodes may be used in a variety of symmetrical slits, such as, for example, in a 6, 8, 10, type symmetrical slits. The ion current of the ion beams extracted from a plasma chamber, such as the plasma chamber 109 may depend on the local plasma density, the separation distance between each hidden deflection electrode, and the extraction voltage. In the example of FIG. 8A, the electrostatic equipotential lines 220 follow identical patterns in the region of each pair of ion beams. This may be produced when identical combinations of bias voltage are applied to a hidden deflection electrode and a focusing voltage is applied to a hidden focusing electrode. As a result, ion beams having identical IAD may be extracted, such as the ion beam 812, ion beam 814, ion beam 816, ion beam 818, ion beam 822, ion beam 824, ion beam 826, and ion beam 828.

Different combinations of bias voltage applied to a hidden deflection electrode and focusing voltage applied to a hidden focusing electrode may result in extracted ion beams having different amount of current and having different IADs.

Depending on the application, such systems may be designed in such a fashion that the ion beams extracted may carry identical or different amount of current and might have identical or different ion angular distributions. As exemplified in FIG. 8A, the substrate 122 is exposed to identical ion angular distributions.

In FIG. 8B, the substrate 122 is be exposed to two pairs of ion beams in which different ion angular distributions are found in the ion beam 822 and ion beam 824, on the one hand, as compared to ion beam 826 and ion beam 828, on the other hand. This may be accomplished by coupling the hidden deflection electrode 712 to a first voltage supply and the hidden deflection electrode 714 to a second voltage supply, so that a different voltage may be applied to the hidden deflection electrode 712 in comparison to that applied to the hidden deflection electrode 714. The hidden focusing electrode 802 may be coupled to a third voltage supply and independently biased with respect to both the hidden deflection electrode 712 (a first hidden deflection electrode) and the hidden deflection electrode 714 (a second hidden deflection electrode).

Thus, the various embodiments described herein provide the benefit of control, adjustment, and steering of IAD over a variety range of angles and angular spreads. By using the hidden deflection electrode 102 and/or the hidden focusing electrode 508, the processing apparatus 100 or other similar processing apparatus provide the benefit of allowing mitigation of the particle generation, control of the IAD in real time, and prevention of materials from the substrate to reach the plasma 108.

In one embodiment, processing apparatus may include an extraction plate disposed along a side of the plasma chamber, the extraction plate having a first aperture and a second aperture, and a middle portion between the first aperture and second aperture and configured to define a first ion beam and second ion beam when the plasma is present in the plasma chamber and an extraction voltage is applied between the extraction plate and a substrate, a hidden deflection electrode disposed adjacent to the middle portion outside of the plasma chamber, and electrically isolated from the extraction plate, and a hidden deflection electrode power supply to apply a bias voltage, acting as a deflection voltage, to the hidden deflection electrode, wherein the bias voltage is configured to at least one of a mean angle of incidence of ions and a range of angles of incidence centered around the mean angle in the first ion beam and the second ion beam. Moreover, the various embodiments may be used in processing systems composed of a multitude of processing apparatuses as described herein, that may be arranged on the same extraction plate and have a hidden deflection electrode at different electrostatic potentials to provide a multitude of ion beamlets having different IADs.

In one embodiment, the extraction plate includes a third aperture and a fourth aperture and a second middle portion arranged between the third aperture and fourth aperture, the third aperture and fourth aperture being configured to define a third ion beam and fourth ion beam when the plasma is present in the plasma chamber and an extraction voltage is applied between the extraction plate and a substrate. In one embodiment, the processing apparatus further comprises a second hidden deflection electrode disposed adjacent the second middle portion outside of the plasma chamber, and electrically isolated from the extraction plate; and a second hidden deflection electrode power supply to apply a second bias voltage to the second hidden deflection electrode independently of the bias voltage applied to the hidden deflection electrode.

In one embodiment, the processing apparatus further comprises a multi-aperture hidden focusing electrode concealed from the plasma chamber, and electrically isolated from the extraction plate and the hidden deflection electrode and the second hidden deflection electrode, the hidden focusing electrode having a first focusing electrode aperture adjacent the hidden deflection electrode and a second focusing electrode aperture adjacent the second hidden deflection electrode, and a hidden focusing electrode voltage supply to apply a focusing voltage to the hidden deflection electrode independent of voltage applied to the hidden deflection electrode and second hidden deflection electrode.

Also, the various embodiments may be used in a processing system composed of a multitude of processing apparatuses, as described herein, that can be arranged on the same extraction plate and have hidden deflection electrode and hidden focusing electrode biased in an identical fashion (identical combinations of deflection electrode bias voltage and focusing electrode bias voltage) to provide a multitude of beamlets having identical IADs. In one embodiment, the processing systems may include a multitude of processing apparatuses that can be arranged on the same extraction plate and have hidden deflection electrode and hidden focusing electrode biased in a different fashion (different combinations of deflection electrode bias voltage and focusing electrode bias voltage) to provide a multitude of beamlets having different IADs.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A plasma processing apparatus comprising:
   an extraction plate disposed along a side of a plasma chamber, the extraction plate having a first aperture and a second aperture, and a middle portion between the first aperture and second aperture, the first aperture and second aperture being configured to define a first ion beam and second ion beam when the plasma is present in the plasma chamber and an extraction voltage is applied between the extraction plate and a substrate;
   a hidden deflection electrode disposed adjacent to the middle portion outside of the plasma chamber, and electrically isolated from the extraction plate; and
   a hidden deflection electrode power supply to apply a bias voltage to the hidden deflection electrode, wherein the bias voltage is configured to modify at least one of a mean angle of incidence of ions in the first ion beam in a first direction and in the second ion beam in a second direction different from said first direction and a range of angles of incidence centered around the mean angle of incidence in the first ion beam and the second ion beam.

2. The processing apparatus of claim 1, wherein the extraction plate forms a first plasma meniscus and a second plasma meniscus from which the first ion beam and second ion beam are formed, respectively.

3. The processing apparatus of claim 1, wherein the extraction plate further includes a first outer portion of the extraction plate outside the first aperture, a second outer portion of extraction plate outside of second aperture and coplanar with the first outer portion, wherein the middle portion is non-coplanar with the first outer portion and second outer portion.

4. The processing apparatus of claim 1, further comprising a hidden focusing electrode disposed adjacent to the hidden deflection electrode outside of the plasma chamber, and electrically isolated from the extraction plate and the hidden deflection electrode.

5. The processing apparatus of claim 4, wherein the hidden focusing electrode includes a third aperture disposed adjacent to the middle portion, wherein the third aperture is configured to allow the first ion beam and the second ion beam to pass therethrough.

6. The processing apparatus of claim 5, further comprising a second hidden deflection electrode power supply to apply a second bias voltage to the hidden focusing electrode.

7. The processing apparatus of claim 6, wherein the second bias voltage applied to the hidden focusing electrode is configured to adjust one or more of the range of angles of incidence and the mean angle of incidence of the first ion beam and the second ion beam.

8. The processing apparatus of claim 7, wherein the hidden deflection electrode and the hidden focusing electrode each configured to move in a direction perpendicular to the middle portion of the extraction plate.

9. The processing apparatus of claim 7, wherein the hidden deflection electrode and the hidden focusing electrode are interoperative to adjust the range of angles of incidence and the mean angle of incidence independently of one another.

10. The processing apparatus of claim 1, wherein the hidden deflection electrode is a first hidden deflection electrode, the extraction plate includes a third aperture and a fourth aperture and a second middle portion arranged between the third aperture and fourth aperture, the third aperture and fourth aperture being configured to define a third ion beam and fourth ion beam when the plasma is present in the plasma chamber and an extraction voltage is applied between the extraction plate and a substrate, the processing apparatus further comprising:
 a second hidden deflection electrode disposed adjacent the second middle portion outside of the plasma chamber, and electrically isolated from the extraction plate; and
 a second hidden deflection electrode power supply to apply a second bias voltage to the second hidden deflection electrode independently of the bias voltage applied to the first hidden deflection electrode.

11. The processing apparatus of claim 10, further comprising:
 a multi-aperture hidden focusing electrode concealed from the plasma chamber, and electrically isolated from the extraction plate and the first hidden deflection electrode and the second hidden deflection electrode, the multi-aperture hidden focusing electrode having a first focusing electrode aperture adjacent the first hidden deflection electrode and a second focusing electrode aperture adjacent the second hidden deflection electrode, and
 a hidden focusing electrode voltage supply to apply a focusing voltage to the multi-aperture hidden focusing electrode independent of voltage applied to the first hidden deflection electrode and second hidden deflection electrode.

12. A plasma processing system comprising:
 a plasma source coupled to a plasma chamber to generate a plasma in the plasma chamber;
 an extraction plate disposed along a side of the plasma chamber, the extraction plate having a first aperture and a second aperture, and a middle portion between the first aperture and second aperture and configured to define a first ion beam and second ion beam when the plasma is present in the plasma chamber and an extraction voltage is applied between the extraction plate and a substrate;
 a hidden deflection electrode disposed adjacent to the middle portion outside of the plasma chamber, and electrically isolated from the extraction plate; and
 a hidden deflection electrode power supply to apply a bias voltage to the hidden deflection electrode, wherein the bias voltage is configured to modify at least one of a mean angle of incidence of ions in the first ion beam in a first direction and in the second ion beam in a second direction different from said first direction and a range of angles of incidence centered around the mean angle of incidence in the first ion beam and the second ion beam.

13. The processing system of claim 12, wherein the extraction plate further includes a first outer portion of the extraction plate outside the first aperture, a second outer portion of extraction plate outside of second aperture and coplanar with the first outer portion, wherein the middle portion extends into the plasma chamber away from the first outer portion and the second outer portion, and the middle portion is non-coplanar with the first outer portion and second outer portion is non-coplanar with the first outer portion and second outer portion.

14. The processing system of claim 13, wherein the extraction plate forms a first plasma meniscus between the middle portion and the first outer portion and a second plasma meniscus between the middle portion and the second outer portion from which the first ion beam and the second ion beam are formed, respectively, wherein the first plasma meniscus and the second plasma meniscus are symmetrically oriented at a predetermined angle.

15. The processing system of claim 12, further comprising a hidden focusing electrode disposed adjacent to the hidden deflection electrode outside of the plasma chamber, and electrically isolated from the extraction plate and the hidden deflection electrode, wherein the hidden focusing electrode includes a third aperture disposed adjacent to the hidden deflection electrode, wherein the third aperture is configured to allow the first ion beam and the second ion beam to pass through, wherein the hidden deflection electrode and the hidden focusing electrode each configured to independently move in a direction perpendicular to the middle portion of the extraction plate.

16. The processing system of claim 15, further comprising a second hidden focusing electrode power supply to apply a second bias voltage to the hidden focusing electrode, wherein the second bias voltage applied to the hidden focusing electrode is configured to adjust one or more of the range of angles of incidence and the mean angle of incidence of the first ion beam and the second ion beam, and wherein the hidden deflection electrode and the hidden focusing electrode are interoperative to adjust the range of angles of incidence and the mean angle of incidence in the first ion beam and the second ion beam independently of one another.

17. The processing system of claim 12, further comprising a plurality of hidden deflection electrodes and a multi-aperture hidden focusing electrode, wherein:
the plurality of hidden deflection electrodes are configured to receive a deflection voltage independently of one another, wherein
the multi-aperture hidden focusing electrode includes a plurality of apertures that are adjacent the respective plurality of hidden deflection electrodes, and wherein
the plurality of hidden deflection electrodes and the multi-aperture hidden focusing electrode are configured to generate a plurality of pairs of ion beams in which a first ion angular distribution in a first pair of ion beams directed through a first focusing electrode aperture is different from a second ion angular distribution in a second pair of ion beams directed through a second focusing electrode aperture.

18. A method of controlling an ion beam using a hidden deflection electrode provided to a substrate, comprising:
generating a plasma in a plasma chamber adjacent a process chamber that contains the substrate;
providing an extraction plate disposed along a side of the plasma chamber, the extraction plate having a first aperture and a second aperture, and a middle portion between the first aperture and second aperture, the first aperture and second aperture being configured to define a first ion beam and second ion beam when the plasma is present in the plasma chamber and an extraction voltage is applied between the extraction plate and the substrate;
arranging the hidden deflection electrode adjacent to the middle portion outside of the plasma chamber, and electrically isolated from the extraction plate; and
applying a bias voltage to the hidden deflection electrode, wherein the bias voltage is configured to modify at least one of a mean angle of incidence of ions in the first ion beam in a first direction and in the second ion beam in a second direction different from said first direction and a range of angles of incidence centered around the mean angle of incidence in the first ion beam and the second ion beam.

19. The method of claim 18, further comprising arranging the first aperture and second aperture to define a respective first aperture plane and a second aperture plane that each forms a non-zero angle with respect to a plane of the substrate.

20. The method of claim 18 wherein the hidden deflection electrode is a first hidden deflection electrode, the method further comprising:
providing a third aperture and a fourth aperture and a second middle portion arranged between the third aperture and fourth aperture, the third aperture and fourth aperture being configured to define a third ion beam and fourth ion beam when the plasma is present in the plasma chamber and an extraction voltage is applied between the extraction plate and the substrate;
providing a second hidden deflection electrode disposed adjacent the second middle portion outside of the plasma chamber, and electrically isolated from the extraction plate; and
providing a multi-aperture hidden focusing electrode concealed from the plasma chamber, and electrically isolated from the extraction plate and the first hidden deflection electrode and the second hidden deflection electrode, the multi-aperture hidden focusing electrode having a first focusing electrode aperture adjacent the first hidden deflection electrode and a second focusing electrode aperture adjacent the second hidden deflection electrode, wherein
the first hidden deflection electrode, second hidden deflection electrode, and the multi-aperture hidden focusing electrode are configured to generate a plurality of pairs of ion beams in which a first ion angular distribution in a first pair of ion beams directed through the first focusing electrode aperture is different from a second ion angular distribution in a second pair of ion beams directed through the second focusing electrode aperture.

* * * * *